United States Patent
Utomo et al.

(10) Patent No.: US 9,905,694 B2
(45) Date of Patent: Feb. 27, 2018

(54) FIN-TYPE FIELD-EFFECT TRANSISTORS WITH STRAINED CHANNELS

(71) Applicant: GLOBALFOUNDRIES Inc., Grand Cayman (KY)

(72) Inventors: Henry K. Utomo, Newbergh, NY (US); Reinaldo A. Vega, Mahopac, NY (US); Yun Y. Wang, Poughquag, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/457,017

(22) Filed: Mar. 13, 2017

(65) Prior Publication Data
US 2018/0026137 A1    Jan. 25, 2018

Related U.S. Application Data

(62) Division of application No. 15/214,854, filed on Jul. 20, 2016, now Pat. No. 9,680,019.

(51) Int. Cl.
*H01L 29/78* (2006.01)

(52) U.S. Cl.
CPC ...... *H01L 29/7851* (2013.01); *H01L 29/7849* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795–29/66818; H01L 29/785–29/7856; H01L 2924/13067; H01L 29/04–29/045; H01L 29/16–29/1608

See application file for complete search history.

(56) References Cited

U.S. PATENT DOCUMENTS

| | | | | |
|---|---|---|---|---|
| 8,039,349 | B2 * | 10/2011 | Hargrove | H01L 21/26586 257/E21.057 |
| 8,729,627 | B2 * | 5/2014 | Cheng | H01L 21/823807 257/288 |
| 9,263,587 | B1 * | 2/2016 | Jacob | H01L 29/66803 |
| 9,455,196 | B2 | 9/2016 | Pradhan et al. | |

(Continued)

OTHER PUBLICATIONS

Y. Y. Wang et al., "Strain mapping of Si devices with stress memorization processing", Appl. Phys. Lett. 103, 052104 (2013); doi: 10.1063/1.4816743.

*Primary Examiner* — Scott B Geyer
(74) *Attorney, Agent, or Firm* — Thompson Hine LLP; Yuanmin Cai

(57) ABSTRACT

Device structures for a fin-type field-effect transistor (Fin-FET) and methods for fabricating a device structure for a FinFET. A fin comprised of a semiconductor material having a first crystal structure is formed. A dielectric layer is formed that includes an opening aligned with the fin. A dummy gate structure is removed from the opening in the dielectric layer. After the dummy gate structure is removed, a section of the fin aligned with the opening is implanted with non-dopant ions to amorphize the first crystal structure of the semiconductor material of the fin. After the section of the fin is implanted, the section of the fin is annealed such that the semiconductor material in the section of the fin recrystallizes with a second crystal structure incorporating internal strain.

7 Claims, 2 Drawing Sheets

(56) References Cited

U.S. PATENT DOCUMENTS

| | | | |
|---|---|---|---|
| 9,490,332 B1 | 11/2016 | Balakrishnan et al. | |
| 2004/0198031 A1* | 10/2004 | Lin | H01L 21/823412 438/585 |
| 2009/0280626 A1* | 11/2009 | Zhu | H01L 29/42384 438/479 |
| 2013/0161762 A1 | 6/2013 | Kelly et al. | |
| 2015/0348851 A1* | 12/2015 | Sampson | H01L 29/785 438/157 |
| 2016/0197004 A1* | 7/2016 | Akarvardar | H01L 21/76202 257/509 |
| 2016/0211371 A1* | 7/2016 | Tsai | H01L 29/7848 |
| 2016/0225881 A1* | 8/2016 | Xu | H01L 21/324 |
| 2016/0240617 A1* | 8/2016 | Then | H01L 29/802 |
| 2016/0379867 A1* | 12/2016 | Doris | H01L 29/66795 438/157 |
| 2016/0379981 A1* | 12/2016 | Balakrishnan | H01L 27/0924 257/192 |
| 2017/0104070 A1* | 4/2017 | Chen | H01L 21/02532 |

\* cited by examiner

FIN-TYPE FIELD-EFFECT TRANSISTORS WITH STRAINED CHANNELS

BACKGROUND

The present invention relates to semiconductor device fabrication and integrated circuits and, more specifically, to device structures for a fin-type field-effect transistor (FinFET) and methods for fabricating a device structure for a FinFET.

A FinFET is a non-planar device structure that is capable of being more densely packed in an integrated circuit than planar field-effect transistors. In addition to the increase in packing density, FinFETs also offer superior short channel scalability, reduced threshold voltage swing, higher mobility, and the ability to operate at lower supply voltages than traditional planar field-effect transistors. A FinFET includes one or more fins of semiconductor material and an overlapping gate electrode that intersects a channel of the one or more fins. The fin dimensions determine the effective channel width of the FinFET. Heavily-doped source/drain regions are formed in fin sections that are not covered by the gate electrode. The channel is located in each fin between these heavily-doped source/drain regions.

Epitaxial semiconductor films may be used as stressors to modify the performance of a FinFET. For example, an epitaxial semiconductor film can be used to increase the carrier mobility through the channel of a field-effect transistor by inducing stresses in the channel. These stressors may participate in forming the source/drain regions of the FinFET.

Improved device structures for a FinFET and fabrication methods for making a device structure for a FinFET are needed.

SUMMARY

According to an embodiment, a structure includes a fin of semiconductor material and a dielectric layer that includes an opening aligned with a section of the fin. The semiconductor material in the section of the fin has a recrystallized crystal structure incorporating internal strain.

According to another embodiment, a method includes forming a fin comprised of a semiconductor material having a first crystal structure, forming a dielectric layer that includes an opening aligned with the fin, and removing a dummy gate structure from the opening in the dielectric layer. After the dummy gate structure is removed, a section of the fin aligned with the opening is implanted with non-dopant ions to amorphize the first crystal structure of the semiconductor material of the fin. After the section of the fin is implanted, the section of the fin is annealed such that the semiconductor material in the section of the fin recrystallizes with a second crystal structure incorporating internal strain.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
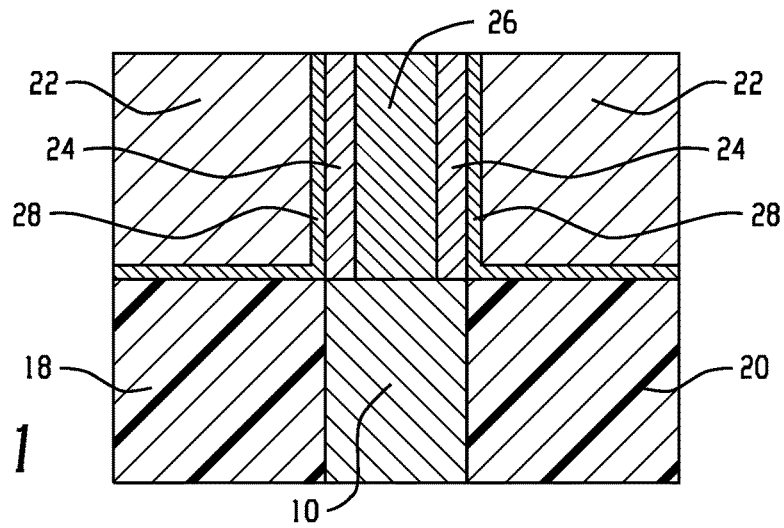
FIGS. 1-5 are cross-sectional views of a substrate at successive fabrication stages of a processing method to form a fin-type field-effect transistor in accordance with an embodiment of the invention.

With reference to FIG. 1 and in accordance with an embodiment of the invention, a fin 10 is formed from a semiconductor material of a substrate that may be any suitable bulk substrate comprising a single-crystal semiconductor material suitable for forming an integrated circuit. For example, the substrate may be a wafer comprised of single crystal silicon characterized by a (100) crystal lattice orientation, and may be lightly doped p-type bulk wafer. The fin 10 is a three-dimensional body of semiconductor material formed from the substrate. The fin 10 may be formed by photolithography and etching processes, such as double-patterning with a sidewall imaging transfer (SIT) process. The sidewalls of the fin 10 may be vertically oriented relative to (and project from) the top surface of the substrate, which is recessed when the fin 10 is formed. The fin 10 may be located in an area on the substrate used to making either p-type field-effect transistors or n-type field-effect transistors.

In a replacement metal gate process, raised source/drain regions 18, 20 are located adjacent to the fin 10. The raised source/drain regions 18, 20 may be comprised of epitaxial semiconductor material, such as silicon germanium (SiGe) or carbon-doped silicon (SiC), and may be in situ doped during growth to impart a given conductivity type to the grown semiconductor material. The semiconductor material of the raised source/drain regions 18, 20 may comprise a p-type dopant selected from Group III of the Periodic Table (e.g., boron (B)) that is effective to impart p-type conductivity, or an n-type dopant from Group V of the Periodic Table (e.g., phosphorus (P) or arsenic (As)) that is effective to impart n-type conductivity. As used herein, the term "source/drain region" means a doped region of semiconductor material that can function as either a source or a drain of a field-effect transistor. The source/drain regions 18, 20 may be used to merge the source and drain regions inside the fin 10 with the source and drain regions of adjacent fins to provide a larger contact areas, provide a dopant source for doping the source and drain regions inside the fin 10 by diffusion during a high temperature anneal, and/or function as stressors transferring stress to the respective fin channels if their constituent material is internally stained.

A dummy gate structure 26 is formed in an overlapping relationship with the fin 10 and may be composed of a sacrificial material, such as polysilicon deposited by chemical vapor deposition (CVD), and has a section located above the fin 10. Non-conductive spacers 24 are formed on the sidewalls of the dummy gate structure 26. The spacers 24 may be formed by depositing a conformal layer comprised of a dielectric material, such as silicon nitride ($Si_3N_4$) deposited by CVD, and shaping the conformal layer with an anisotropic etching process, such as reactive ion etching, that preferentially removes the dielectric material from horizontal surfaces. A dielectric liner 28 is formed on the raised source/drain regions 18, 20 and the spacers 24.

A dielectric layer 22 is located on the raised source/drain regions 18, 20, and is formed after the spacers 24, dummy gate structure 26, and dielectric liner 28 are formed. The dielectric layer 22 may be composed of a dielectric material, such as an electrical insulator like silicon dioxide ($SiO_2$) deposited by CVD, that is planarized to the top surface of the dummy gate structure 26. The dielectric layer 22 surrounds the dummy gate structure 26, which can be removed by a selective etching process due to the exposure arising from the planarization of the dielectric layer 12 and the dummy gate structure 26.

Figure 2:
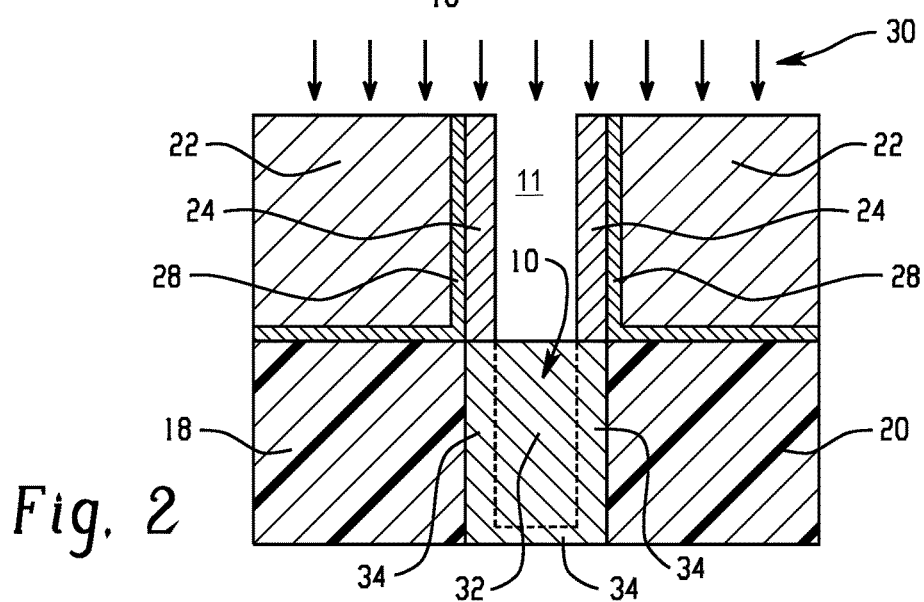

With reference to FIG. 2 in which like reference numerals refer to like features in FIG. 1 and in a subsequent fabrication stage of the processing method, the dummy gate structure 26 may be removed from to form an opening 11 in the dielectric layer 22 so that the space interior of the spacers 24 and overlying the top surface of the fin 10 is opened. The raised source/drain regions 18, 20 are covered by the dielectric layer 22 when the dummy gate structure 26 is removed and the top surface of the fin 10 is revealed.

A block mask (not shown) may be applied to cover an area on the substrate with fins (not shown) used to fabricate FinFETs having different characteristics than the characteristics of a FinFET fabricated using fin 10. For example, the fin 10 may be used to fabricate a p-type FinFET and fins in an area covered by the block mask may be used to fabricate n-type FinFETs so that the n-type FinFETs are not affected. The end result is that the strain imparted to the fin 10, and other fins similar to fin 10, is not global to both types of FinFETs.

An amorphized section 32 is formed in an upper part of the fin 10 and other fins similar to fin 10. To that end, energetic ions, as indicated diagrammatically by the single-headed arrows 30, are introduced, such as by implantation, through the opening 11 in the dielectric layer 22 and into the fin 10 to form the amorphized section 32. The ions 30 are stopped within the thickness of the block mask such that the fins (not shown) in the selected area of the substrate covered by the block mask are not implanted. The ions 30 are also stopped within the thickness of the dielectric layer 22 such that the raised source/drain regions 18, 20 are not implanted. The long range order of the crystal lattice structure of the semiconductor material of the fin 10 is lost as a consequence of the implantation to result in the amorphized section 32.

Sections 34 of the fin 10 are not amorphized by the implanted ions 30. The spacers 24 operate as an implantation mask such that underlying crystalline sections 34 of the fin 10 are not implanted and amorphized. In addition, the depth of the amorphized section 32 relative to the top surface of the fin 10 may be limited such that another crystalline section 34 may exist at a greater depth into the fin 10. These crystalline sections 34 retain the long range order of the crystal lattice structure of the semiconductor material of the fin 10 and supply a crystalline template for recrystallization of the amorphized section 32 during a subsequent anneal. The extent of the amorphized section 32 relative to the top surface of the fin 10 can be controlled through selection of implantation conditions The ions 30 may be generated from a suitable source gas and implanted with selected implantation conditions using an ion implantation tool. The implantation conditions (e.g., ion species, dose, kinetic energy) may be selected to tune the characteristics of the amorphized section 32. For example, the amorphized section 32 may be formed using chained implants (e.g., multiple discrete implantations at different kinetic energies). In an embodiment, the ions 30 may comprise a non-dopant ion species selected from silicon (Si), germanium (Ge), or carbon (C). Consequently, the amorphized section 32 may be formed without introducing ions comprising an electrically-active dopant into the semiconductor material of the fin 10.

The ion trajectories penetrate into the semiconductor material of the fin 10 with a profile characterized by a projected range and a range straggle. The crystal structure of the fin 10 is altered in the amorphized section 32 relative to its initial single-crystal state by implantation damage originating from the ions 30 and causing amorphization. The energetic ions 30, as they penetrate into the fin 10, lose kinetic energy via scattering events with atoms and electrons in the constituent semiconductor material of the fin 10. Energy lost in nuclear collisions displaces atoms of the fin 10 from their original lattice sites, which damages the lattice structure of the fin 10 and causes point defects. Essentially all of the implanted ions 30 stop within a distance of three times the range straggle from the projected range, which implies that the depth profile for the point defects is spatially similar to the depth profile for the ions 30.

Figure 3:
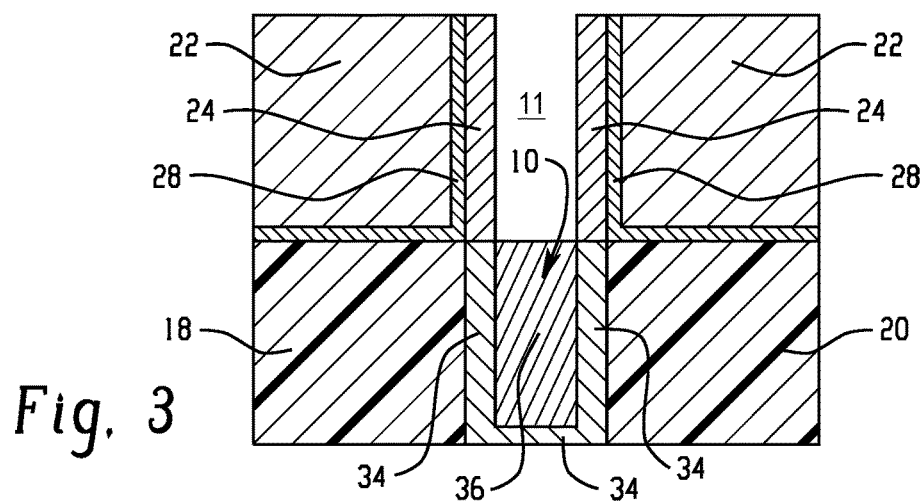
Figure 4:
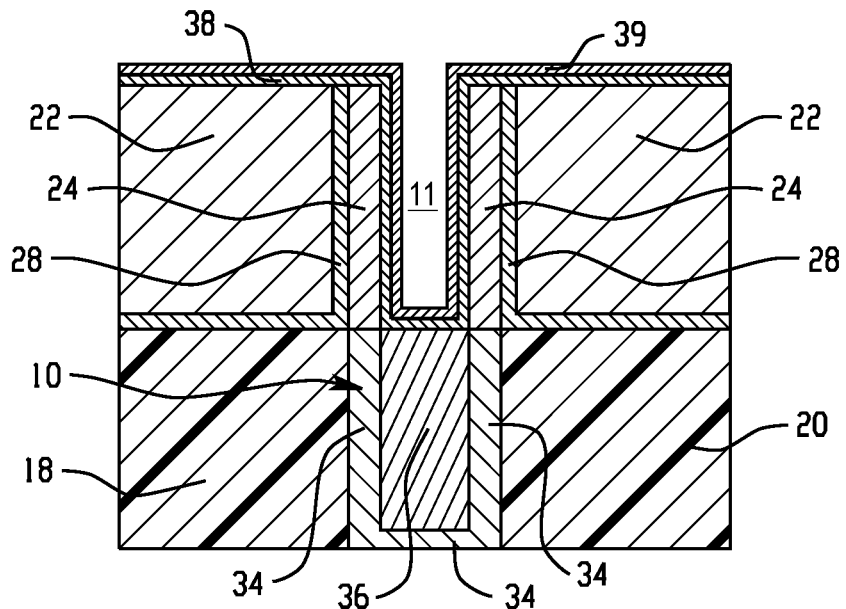

With reference to FIGS. 3 and 4 in which like reference numerals refer to like features in FIG. 2 and in a subsequent fabrication stage of the processing method, the semiconductor material in the amorphized section 32 of the fin 10 may be recrystallized to form a recrystallized section 36 that is strained and incorporates internal stain. The strain in the recrystallized section 36 may be maintained in the final device construction for a FinFET and may transfer stress to the channel of the fin 10 beneath the gate that strains the channel. During recrystallization, the crystal structure of the single crystal semiconductor material of the crystalline sections 34 provides as a template for epitaxial growth characterizing the recrystallization of the amorphized section 32. However, the crystal structure of the recrystallized semiconductor material in the recrystallized section 36 of the fin 10 may differ from the original crystal structure of the semiconductor material of the fin 10 and incorporates internal strain as a result of the different crystal structure. The recrystallization may be accomplished in multiple different ways.

In an embodiment, the semiconductor material in the amorphized section 32 of the fin 10 may be recrystallized to form the recrystallized section 36 by solid phase epitaxy (SPE). For example, laser spike annealing (LSA) may be used to rapidly recrystallize the amorphized section 32 and form the recrystallized section 36. For example, the laser spike annealing may comprise a pulse of coherent electromagnetic energy with a pulse length of less than 0.1 second (e.g., one millisecond) that heats the amorphized section 32 of the fin 10 to a temperature within a range of, for example, 700° C. to 1300° C. Other similar approaches include, but are not limited to, rapid thermal annealing (RTA) and dynamic surface annealing (DSA). Following the solid phase epitaxy process, the recrystallized section 36 will be strained and incorporate internal stress and strain.

In an embodiment and with specific reference to FIG. 4, the semiconductor material in the amorphized section 32 of the fin 10 may be recrystallized to form the recrystallized section 36 using a stress memorization technique (SMT). In the context of SMT, one or more layers 38, 39 of dielectric material may be deposited inside the opening 11 in the dielectric layer 22 and on the top surface of the fin 10. The layers 38, 39 are present during a subsequent thermal anneal that promotes the recrystallization. The thermal anneal, which may be performed in a furnace with the layers 38, 39 in place, causes the atoms in the amorphized section 32 to rearrange into a crystalline form through a recrystallization process. The anneal temperature and duration can be used to control the properties of the recrystallized section 36. Representative anneal conditions may be a temperature in a range of 600° C. to 700° C. for a time ranging from 15 minutes to 45 minutes. The thermal anneal may be executed in a non-reactive environment, such as in an argon (Ar) or nitrogen ($N_2$) atmosphere.

In a representative embodiment, the one or more dielectric layers 38, 39 may comprise an oxide layer 38 and a nitride layer 39 that are formed in the opening 11 in the dielectric layer 22 and arranged in a conformal layer stack that contacts the top surface of the fin 10. The oxide layer 38 and the nitride layer 39 operate to affix and hold the amorphized section 32 during recrystallization of its amorphized semiconductor material. The nitride layer 39 may be deposited by CVD under deposition conditions that cause the nitride layer 39 to be under stress and thereby incorporate either compressive strain or tensile strain.

The nitride layer 39 transfers stress to the amorphized section 32 during the process recrystallizing the semiconductor material in the amorphized section 32 of the fin 10. After the nitride layer 39 is removed by a wet and/or dry etch following recrystallization, the semiconductor material in the recrystallized section 36 of the fin 10 may relax with the removal of the constraint supplying the transferred stress, but will nevertheless remain strained. The oxide layer 38 may be removed during a subsequent portion of the fabrication process that forms the replacement gate structure.

Although not wishing to be bound by theory, the internal strain incorporated into the recrystallized section 36 following implantation and SPE or SMT may result from the formation of crystalline defects in the semiconductor material of the recrystallized section 36 and/or a change in the lattice constant of the recrystallized section 36. The crystalline defects may be stacking faults and/or dislocations introduced into the semiconductor material of the recrystallized section 36. A number of crystalline defects in the semiconductor material of the recrystallized section 36, which does not retain the original crystal structure of the fin 10, is greater than a number of crystalline defects in the semiconductor material of the crystalline sections 34, which retain the original crystal structure of the fin 10. The lattice constant of the recrystallized section 36 may be larger than the lattice constant of the channel of the fin 10 or smaller than the lattice constant of the channel of the fin 10.

In an embodiment and without limitation as to theory, strain may be induced in the recrystallized section 36 as the crystal lattice stretches to mimic a lattice constant that is larger than the lattice constant of the semiconductor material, e.g., silicon, of the channel of the fin 10 following implantation with, for example, germanium and recrystallization to form a solid solution in the recrystallized section 36 with the larger lattice constant. The strain applied to the channel of the fin 10 in this instance is compressive strain. Conversely, tensile strain may be induced in the recrystallized section 36 as the crystal lattice relaxes to mimic a lattice constant that is smaller than the lattice constant of the semiconductor material, e.g., silicon, of the channel of the fin 10 following implantation with, for example, carbon and recrystallization to form a solid solution in the recrystallized section 36 with the smaller lattice constant. The strain applied to the channel of the fin 10 in this instance is tensile strain.

The internal strain of the recrystallized section 36 applies a stress to the channel of the fin 10, which is placed under strain in response to the applied stress. The channel of the fin 10 is not implanted and retains the original crystal structure of the semiconductor material of the fin 10. In an embodiment, the applied stress may be compressive stress that produces compressive strain in the channel. For example, the compressive strain in the channel may be produced by implanting the fin 10 with germanium to form the amorphized section 32 that is recrystallized. If the FinFet is a p-type field-effect transistor, then carrier mobility can be enhanced by the compressive strain induced in the channel of the fin 10 by the recrystallized section 36. In an alternative embodiment, the applied stress may be tensile stress that produces tensile strain in the channel. For example, the compressive strain in the channel may be produced by implanting the fin 10 with carbon to form the amorphized section 32 that is recrystallized. If the FinFet is an n-type field-effect transistor, then carrier mobility can be enhanced by the tensile strain induced in the channel of the fin 10 by the recrystallized section 36.

The introduction of the recrystallized section 36 and its internal stress may be particularly application in circuit designs with dense fin pitches. In such circuit designs, traditional embedded stressors in the source/drain regions lose their effectiveness for stress transfer to strain the channel inside the fin. Embedded stressors cannot be moved closer to the channel because of the tight tolerances created by fine spacings. Increasing the strain in embedded stressors comprised of silicon germanium becomes impractical because of the increase in defects with increasing germanium content in the material and the resulting reliability problems.

Figure 5:
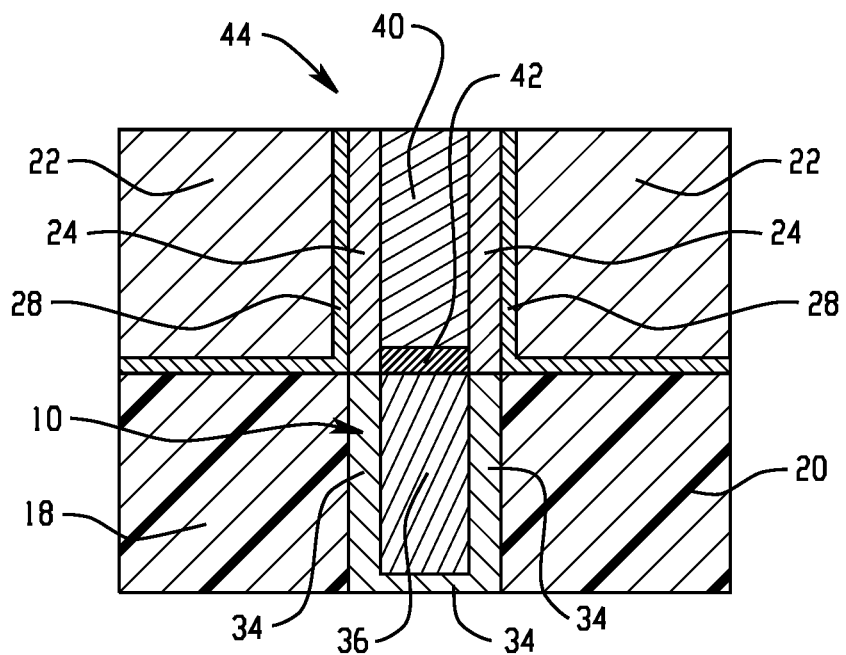

With reference to FIG. 5 in which like reference numerals refer to like features in FIGS. 3 and 4 and in a subsequent fabrication stage of the processing method, a gate structure that includes a gate electrode 40 and a gate dielectric 42 is formed inside at least a portion of the space vacated by the dummy gate structure 26 so as to replace the dummy gate structure 26. The gate electrode 40 may be comprised of a metal, such as aluminum or tungsten, deposited by physical vapor deposition (PVD), CVD, etc. The gate dielectric 42 may be comprised of a dielectric material that is electrically insulating against conduction, such as a high-k dielectric material like hafnium oxide or hafnium oxynitride, silicon dioxide, silicon oxynitride, or layered combinations of these dielectric materials, deposited by chemical vapor deposition, atomic layer deposition (ALD), etc. The gate electrode 40 may be comprised of a metal, such as aluminum or tungsten, deposited by PVD, CVD, etc. The gate electrode 40 may also include one or more work function metal layers present to adjust the threshold voltage. The gate dielectric 42 may be comprised of a dielectric material that is electrically insulating, such as silicon dioxide, silicon oxynitride, a high-k dielectric material such as hafnium oxide or hafnium oxynitride, or a layered combination of these dielectric and other insulating materials, deposited by CVD, ALD, etc. The gate structures may be formed by depositing a layer stack of the constituent materials of the gate electrode 40 and gate dielectric 42 to fill the opening 11 interior of the spacers 24, and removing the gate stack from the field area on the top surface of the dielectric layer 22 by planarization, such as with chemical mechanical polishing (CMP).

The resulting fin-type field-effect transistor (FinFET) 44 includes the fin 10, the gate electrode 40 and gate dielectric 42, the raised source/drain regions 18, 20, source and drain regions inside the fin 10, and a channel inside the fin 10 that is arranged along the length of the fin 10 between the source/drain region 18 and the source/drain region 20. The gate electrode 40 and gate dielectric 42 may overlap multiple sides of the fin 10 at a location spaced along the length of the fin 10 from the raised source/drain regions 18, 20.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a fin comprised of a semiconductor material having a first crystal structure; and
    a dielectric layer extending above the fin, the dielectric layer including an opening aligned with a section of the fin,
    wherein the semiconductor material in the section of the fin has a second crystal structure that incorporates internal strain.

2. The structure of claim 1 wherein the opening is framed by sidewall spacers, and the fin includes a first portion adjacent to the section and a second portion underlying the sidewall spacers, and the first portion of the fin and the second portion of the fin have the first crystal structure.

3. The structure of claim 1 wherein the section of the fin is less than a full height of the fin.

4. The structure of claim 1 wherein the internal strain is compressive strain.

5. The structure of claim 1 wherein the internal strain is tensile strain.

6. The structure of claim 1 further comprising:
    a gate structure of a fin-type field-effect transistor inside at least a portion of the opening in the dielectric layer.

7. The structure of claim 1 wherein the semiconductor material with the first crystal structure has a first number of defects, and the semiconductor material with the second crystal structure has a second number of defects that is greater than the first number of defects.

\* \* \* \* \*